(12) United States Patent
Bentley et al.

(10) Patent No.: US 6,611,213 B1
(45) Date of Patent: Aug. 26, 2003

(54) METHOD AND APPARATUS FOR DATA COMPRESSION USING FINGERPRINTING

(75) Inventors: Jon Louis Bentley, New Providence, NJ (US); Malcolm Douglas McIlroy, Etna, NH (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/273,840

(22) Filed: Mar. 22, 1999

(51) Int. Cl.[7] .............................. H03M 7/00; H03M 7/34
(52) U.S. Cl. .............................. 341/51; 341/67; 341/53; 341/50
(58) Field of Search .............................. 341/51, 67, 87, 341/76, 50

(56) References Cited

U.S. PATENT DOCUMENTS

| | | | |
|---|---|---|---|
| 4,464,650 A | 8/1984 | Eastman et al. | 340/347 |
| 4,558,302 A | 12/1985 | Welch | 340/347 |
| 5,045,852 A * | 9/1991 | Mitchell et al. | 341/51 |
| 5,134,396 A * | 7/1992 | Sirat et al. | 341/51 |
| 5,369,605 A | 11/1994 | Parks | 364/715.09 |
| 5,371,499 A * | 12/1994 | Graybill et al. | 341/51 |
| 5,373,290 A * | 12/1994 | Lempel et al. | 341/51 |
| 5,408,234 A * | 4/1995 | Chu | 341/51 |
| 5,414,425 A | 5/1995 | Whiting et al. | 341/67 |
| 5,442,350 A | 8/1995 | Iyer et al. | 341/51 |
| 5,550,540 A | 8/1996 | Furlan et al. | 341/51 |
| 5,572,206 A | 11/1996 | Miller et al. | 341/51 |
| 5,572,209 A | 11/1996 | Farmer et al. | 341/67 |
| 5,608,396 A | 3/1997 | Cheng et al. | 341/50 |
| 5,663,721 A | 9/1997 | Rossi | 341/51 |
| 5,673,042 A | 9/1997 | Yoshida et al. | 341/51 |
| 5,701,125 A | 12/1997 | Berlin | 341/63 |
| 5,701,468 A | 12/1997 | Benayoun et al. | 395/612 |
| 5,703,581 A | 12/1997 | Matias et al. | 341/67 |
| 5,729,223 A * | 3/1998 | Trissel | 341/51 |

FOREIGN PATENT DOCUMENTS

| | | | |
|---|---|---|---|
| GB | 2311635 A | 10/1997 | H03M/7/30 |
| WO | WO 9948282 | 9/1999 | H04N/3/15 |

OTHER PUBLICATIONS

J. Bentley et al., "Data Compression Using Long Common Strings", Pproceedings of the 1999 Data Compression Conference, DCC 1999, Mar. 29, 1999, pp. 287–295.

R. Karp et al., "Efficient Randomized Pattern–Matching Algorithms" IBM Jounral of Reasearch and Development, IBM Corporation, Armonk. vol. 31, No. 2, Mar. 1, 1987, pp. 249–260.

(List continued on next page.)

*Primary Examiner*—Michael Tokar
*Assistant Examiner*—Lam Mai
(74) *Attorney, Agent, or Firm*—Donald P. Dinella

(57) ABSTRACT

A method and apparatus for achieving relatively low compression ratios based on the realization of using a longer history and longer common strings of the input data stream as an initial evaluation of the input data prior to applying a particular compression process. More particularly, the input data is preprocessed by applying string-matching to the extract long common strings. The input data is divided into a series of blocks with each individual block having a uniform size, illustratively, 1000 characters in length. Further, a so-called fingerprint is computed and stored for each block. Thereafter, the input data stream is traversed and comparison is made between a particular set of character of the input stream and the computed fingerprints. In particular, the input stream is traversed as a function of a sliding window wherein the present window of characters of the input is compared to the computed fingerprints. Upon detecting a match, the input stream is encoded with an identifier determined as function of the detected match. Thereafter, a compression of the preprocessed and encoded input stream is made, illustratively, using Lempel-Ziv compression.

26 Claims, 7 Drawing Sheets

OTHER PUBLICATIONS

J. T. Wang et al., "Fast Retrival of Electronic Messages That Contain Mistyped Words Or Spelling Errors", IEEE Transactions On Systems, Man and Cybernetics. Part B: Cybernetics, US, IEEE Service Center, vol. 27, No. 3, Jun. 1, 1997.

U.S. Patent No. 5,701,468, filed on May 18, 1995 and issued on Dec. 23, 1997 to A. Benayoun et al.

U.S. Patent No. 5,550,540, filed on Nov. 12, 1992 and issued on Aug. 27, 1996 to G. Furlan, et al.

U.S. Patent No. 5,701,125, filed on Jun. 15, 1994 and issued on Dec. 23, 1997 to G. J. Berlin.

U.S. Patent No. 5,572,209, filed on Aug. 16, 1994 and issued on Nov. 5, 1996 to H. R. Farmer et al.

U.S. Patent No. 4,558,302, filed on Jun. 20, 1983 and issued on Dec. 10, 1985 to T. A. Welch.

U.S. Patent No. 5,703,581, filed on Jun. 14, 1996 and issued on Dec. 30, 1997 to Y. Matias et al.

U.S. Patent No. 5,673,042, filed on Mar. 16, 1995 and issued on Sep. 30, 1997 to S. Yoshida et al.

U.S. Patent No. 5,663,721, filed on Mar. 20, 1995 and issued on Sep. 2, 1997 to M. J. Rossi.

U.S. Patent No. 5,608,396, filed on Feb. 28, 1995 and issued on Mar. 4, 1997 to J-M. Cheng et al.

U.S. Patent No. 5,442,350, filed on Oct. 29, 1992 and issued on Aug. 15, 1995 to B. R. Iyer et al.

U.S. Patent No. 5,572,206, filed on Jul. 6, 1994 and issued on Nov. 5, 1996 to J. W. Miller et al.

U.S. Patent No. 5,369,605, filed on Jul. 7, 1993 and issued on Nov. 29, 1994 to T. J. Parks.

U.S. Patent No. 5,414,425, filed on May 9, 1994 and issued on May 9, 1995 to D. L. Whiting et al.

U.S. Patent No. 4,464,650, filed on Aug. 10, 1981 and issued on Aug. 7, 1984 to W. L. Eastman et al.

C. G. Nevil–Manning et al., "Identifying Hierarchical Structure in Sequences: A linear–time algorithm", *Journal of Artificial Intelligence Research*, 7, 1997, pp. 67–82.

J. G. Cleary et al., "Unbounded Length Contexts for PPM", *The Computer Journal*, vol. 40, No. 2/3, 1997, pp. 67–75.

J. Ziv et al., "A Universal Algorithm for Sequential Data Compression", *IEEE Transactions on Information Theory* vol. IT–23, No. 3, May 1977, pp. 337–343.

J. Ziv et al., "Compression of Individual Sequences via Variable–Rate Coding", *IEEE Transactions on Information Theory*, vol. IT–24, No. 5, Sep. 1978, pp. 530–536.

T. A. Welch, "A Technique for High–Performance Data Compression", *IEEE Computer* Jun. 1984, pp. 8–19.

* cited by examiner

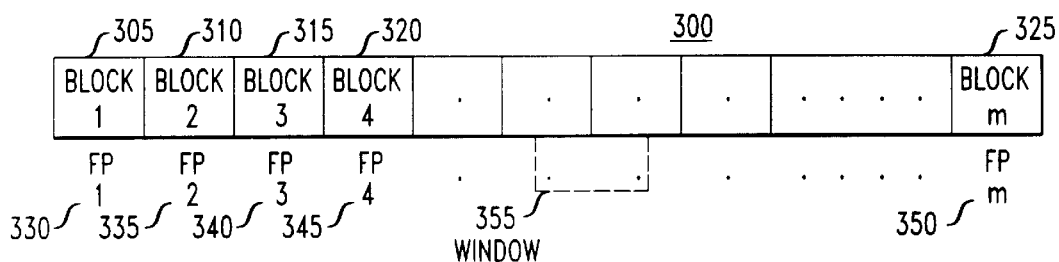
FIG. 3
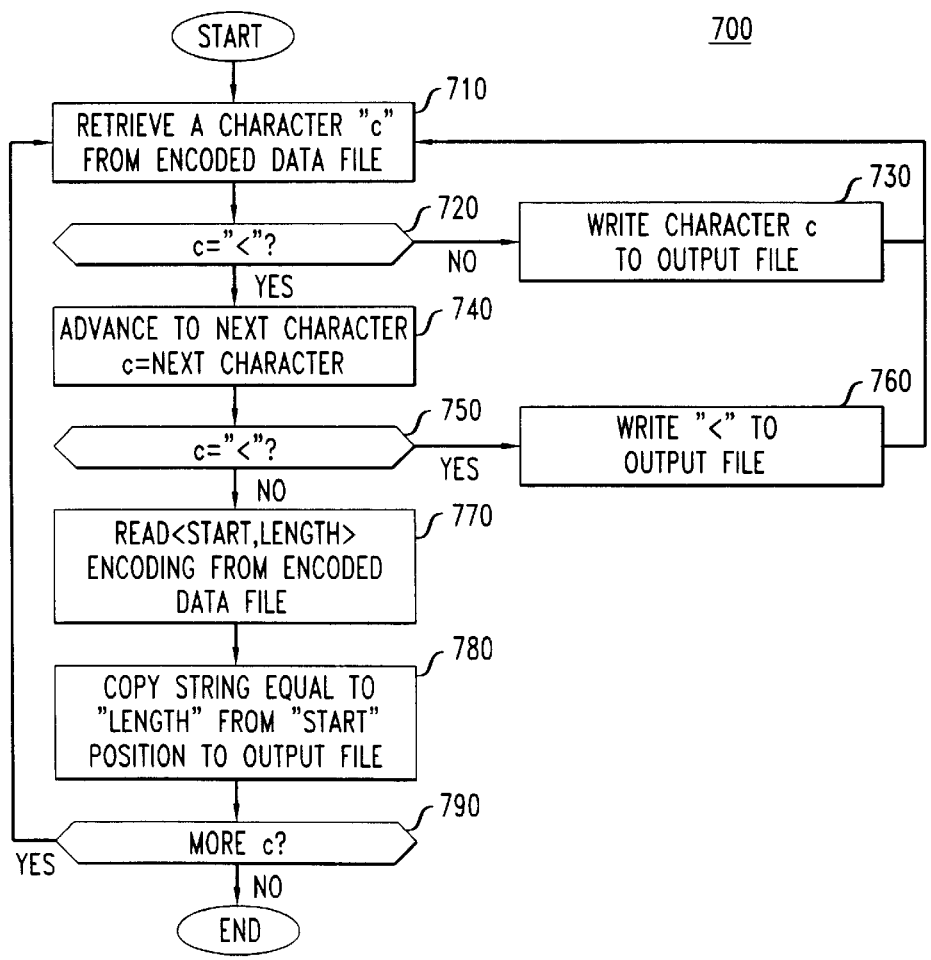
FIG. 4
| INPUT DATA STREAM ⌐400 | ENCODED OUTPUT⌐410 |
|---|---|
| abcdefghijklmnopq<12345 ⌐420 | abcdefghijklmnopq<<12345 ⌐460 |
| abcdefghijabcdefghij ⌐430 | abcdefghij<0,10> ⌐470 |
| abcdefghijklmnopqrstuvwxijklmnopabcdefghqrstuvwx ⌐440 | abcdefghijklmnopqrstuvwx<8,8><0,8><16,8> ⌐480 |
| aaaaaaaaaaaaaaaaaaaaa ⌐450 | a<0,20> ⌐490 |
FIG. 7

FIG. 5

500 the Constitution of the United States PREAMBLE We, the people of t\
he United States, in order to form a more perfect Union, e\
stablish justice, insure domestic tranquility, provide for\
the common defense, promote the general welfare, and secu\
re the blessings of liberty to ourselves and our posterity\
, do ordain and establish this Constitution for the United\
States of America.
Index Article I Section 1 Section 2 Section 3 Section 4 Sect\
ion 5 Section 6 Section 7 Section 8 Section 9 Section \
10 Article II Section 1 Section 2 Section 3 Section \
4)Article III Section 1 Section 2 Section 3 Article I\
v Section 1 Section 2 Section 3 Section 4 Article v \
Article VI Article VII Bill of Rights Amendment I Amen\
dment II Amendment III Amendment IV Amendment V Amendm\
ent VI Amendment VII Amendment VIII Amendment IX Amend\
ment X Amendment XI Amendment XII Amendment XIII Amend\
ment XIV Section 1 Section 2 Section 3 Section 4 Sect\
ion 5 Amendment XV Amendment XVI Amendment XVII Amendm\
ent XVIII Amendment XIX Amendment XX Section 1 Section \
2 Section 3 Section 4 Section 5 Section 6 Amendment \
XXI Amendment XXII Amendment XXIII Amendment XXIV Amen\
dment XXV Section 1 Section 2 Section 3 Section 4 Ame\
ndment XXVI Amendment XXVII PREAMBLE We, the people of t\
he United States, in order to form a more perfect Union, e\
stablish justice, insure domestic tranquility, provide for\
the common defense, promote the general welfare, and secu\
re the blessings of liberty to ourselves and our posterity\
, do ordain and establish this Constitution for the United\
States of America.

ARTICLE I Section 1.
Legislative powers; in whom vested All legislative powers herein \
granted shall be vested in a Congress of the United States\
, which shall consist of a Senate and House of Representat\
ives.

Section 2.
House of Representatives, how and by whom chosen Qualifications of\
a Representative.
Representatives and direct taxes, how apportioned.
Enumeration.
Vacancies to be filled.
Power of choosing officers, and of impeachment.
1.
The House of Representatives shall be composed of members chosen e\
very second year by the people of the several States, and \
the elector in each State shall have the qualifications re\
quisite for electors of the most numerous branch of the St\
ate Legislature.
2.
No person shall be a Representative who shall not have attained th\
e age of twenty-five years, and been seven years a citizen\
of the United States, and who shall not, when elected, be\
an inhabitant of that State in which he shall be chosen.
3.
Representatives (and direct taxes) Altered by 16th Amendment shall\
be apportioned among the several States which may be incl\
uded within this Union, according to their respective numb\
ers, (which shall be determined by adding the whole number\
of free persons, including those bound to service for a t\
erm of years, and excluding Indians not taxed, three-fifth\
s of all other persons.
) Altered by 14th Amendment The actual enumeration shall be made w\
ithin three years after the first meeting of the Congress \
of the United States, and within every subsequent term of \
ten years, in such manner as they shall by law direct.
The number of Representatives shall not exceed one for every thirt\
y thousand, but each State shall have at least one Represe

510 ntative; and until such enumeration shall be made, the Sta\
te of New Hampshire shall be entitled to choose three, Mas\
sachusetts eight, Rhode Island and Providence Plantations \
one, Connecticut five, New York six, New Jersey four, Penn\
sylvania eight, Delaware one, Maryland six, Virginia ten, \
North Carolina five, South Carolina five, and Georgia thre\
e.
4.
When vacancies happen in the representation from any State, the Ex\
ecutive Authority thereof shall issue writs of election to\
fill such vacancies.
5.
The House of Representatives shall choose their Speaker and other \
officers; and shall have the sole power of impeachment.
Section 3.
Senators, how and by whom chosen.
How classified.
State Executive, when to make temporary appointments, in case, etc\
.
Qualifications of a Senator.
President of the Senate, his right to vote.
President pro tem.
, and other officers of the Senate, how chosen.
Power to try impeachments.
When President is tried, Chief Justice to preside.
Sentence.
1.
The Senate of the United States shall be composed of two Senators \
from each State, [chosen by the Legislature thereof,] Alte\
red by 17th Amendment for six years; and each Senator shall\
l have one vote.
2.
Immediately after they shall be assembled in consequence of the fi\
rst election, they shall be divided as equally as may be i\
nto three classes.
The seats of the Senators of the first class shall be vacated at t\
he expiration of the second year, of the second class at t\
he expiration of the fourth year, and of the third class a\
t the expiration of the sixth year, so that one-third may \
be chosen every second year; [and if vacancies happen by r\
esignation, or otherwise, during the recess of the Legisla\
ture of any State, the Executive thereof may make temporar\
y appointments until the next meeting of the Legislature, \
which shall then fill such vacancies.
] Altered by 17th Amendment 3.
No person shall be a Senator who shall not have attained to the ag\
e of thirty years, and been nine years a citizen of the Un\
ited States, and who shall not, when elected, be an inhabi\
tant of that State for which he shall be chosen.

520

4
The Vice-President of the United States shall be President of the \
Senate, but shall have no vote, unless they be equally div\
ided.
5.
The Senate shall choose their other officers, and also a President\
pro tempore, in the absence of the Vice President, or whe\
n he shall exercise the office of the President of the Uni\
ted States.
6.
The Senate shall have the sole power to try all impeachments.
When sitting for that purpose, they shall be on oath or affirmatio\
n.
When the President of the United States is tried, the Chief Justic\
e shall preside; and no person shall be convicted without \
the concurrence of two-thirds of the members present.

| b | com b | com % | com b | gzip | gzip % | total % |
|---|---|---|---|---|---|---|
| ∞ | 66.122 | 100.00 | 22.905 | | 34.64 | 34.64 |
| 4000 | 57.438 | 86.87 | 19.981 | | 34.79 | 30.22 |
| 2000 | 56.986 | 86.18 | 19.842 | | 34.82 | 30.01 |
| 1000 | 56.652 | 85.68 | 19.721 | | 34.81 | 29.82 |
| 500 | 56.319 | 85.17 | 19.602 | | 34.81 | 29.64 |
| 250 | 55.701 | 84.24 | 19.412 | | 34.85 | 29.36 |
| 125 | 54.804 | 82.88 | 19.191 | | 35.02 | 29.02 |
| 62 | 52.446 | 79.32 | 18.841 | | 35.92 | 28.49 |
| 31 | 47.154 | 71.31 | 17.766 | | 37.68 | 26.87 |
| 15 | 43.435 | 65.69 | 18.878 | | 43.46 | 28.55 |
| 7 | 56.498 | 85.45 | 24.724 | | 43.76 | 37.39 |

Columns: 810, 820, 830, 840, 850, 860. Table 800.

FIG. 10

(A) FROM FIG 9

```
)
while ((c=getchar()) != EOF)
        a[n++] = c;
a[n] = a[n-1]+1;  /* Must differ from a[n-1] */
for (i = 0; i < n; i++) {
        oldc = a[i-b];
        c = a[i];
        s = mod(s + CHARSIZE * (double) q - oldc * (double) db, q);
        s = mod(s * (double) d + c, q);
        if (i-b+1 >= clear)
                checksig(s, i);
        if (i % b == b-1)
                store(s, i);
        if (0 && i > 0 && i % 1000000 == 0)
                fprintf(stderr, "Checkpoint %d\n", i);
}
writeseq(clear, n-1);
return 0;
```

```
/* precom.c -- Experiments on file precompression
   Usage: precom <blocksize>
   Reads stdin and writes compressed file onto stdout
*/ include <stdlib.h>
include <stdio.h> void assert(int c, char *s)
{   if (!c) {
        fprintf(stderr, "%s\n", s);
        exit(0);
    }
}

/* MAIN TYPES AND DATA */ typedef long PosType;
typedef unsigned long SigType;  /* Rabin-Karp fingerprint signature */
#define MAXB 100000
#define MAXN 100000000
char origa[MAXN+MAXB];          /* Input string storage */
                                /* Access origa through a (to allow negative indexing)
char *a;                           Block size */
int b;                          /* File size */
PosType n=0;                    /* Start of uncompressed text */
PosType clear=0;

/* SEARCH FOR GOOD MATCHES */ int bestlen;                    /* Longest match found: length */
PosType bestoldstart;           /* Start in transmitted portion */
PosType bestnewstart;           /* Start after a[clear] */ void expandmatch(PosType m1, PosType m2) /* m1 = new, m2 = old */
{
    int i, len;
    m1 = m1-b+1;                /* Point at start of strings. */
    m2 = m2-b+1;                /* not ends */
    for (i = 0; i < b; i++) {
        if (a[m1+i] != a[m2+i])
            return;
    }
    len = b;
    while (a[m1+len] == a[m2+len] && (m1 > clear)) {
        m1--; m2--; len++;
    }
    if (len > bestlen) {
        bestlen = len;
        bestnewstart = m1;
        bestoldstart = m2;
    }
} void writeseq(PosType n1, PosType n2)
{
    PosType i;
    /* works on PC with printf("\n"); here -- see precom8.c */
    for (i = n1; i <= n2; i++) {
        if (a[i] == '<')
            putchar(a[i]);      /* << is quoted */
        putchar(a[i]);
    }
}

/* HASH TABLE */ typedef struct hnode *Hptr;
typedef struct hnode {
    Hptr   next;
    SigType sig;
    PosType pos;
} Hnode;

#define HSIZE 999983
Hptr htab[HSIZE];

void hashinit()
{
    int i;
    for (i = 0; i < HSIZE; i++)
        htab[i] = 0;
} void store(SigType s, PosType i)
{
    int j = s % HSIZE;
    Hptr p = (Hptr) malloc(sizeof(Hnode));
    assert(p != 0, "malloc died");
    p->next = htab[j];
    htab[j] = p;
    p->sig = s;
    p->pos = i;
} void checksig(SigType s, PosType i)
{
    Hptr p;
    bestlen = -1;
    for (p = htab[s%HSIZE]; p; p = p->next)
        if (p->sig == s)
            expandmatch(i, p->pos);
    if (bestlen >= b) {
        writeseq(clear, bestnewstart-1);
        printf("<%ld,%ld>", bestoldstart, bestlen);
        /* replace first parm with bestnewstart-bestoldstart?? */
        clear = bestnewstart+bestlen;
    }
}

/* MAIN */ long mod(double a, long b)
{
    long c = (int) (a / (double) b);
    return (long) (a - ((double) b * (double) c));
} define CHARSIZE 256 int main(int argc, char *argv[])
{
    PosType i;
    int j, c, oldc;
    SigType s = 0, db;   /* d^(b-1) mod q */
    SigType d = 32, q = 1999999973;
    a = origa;
    b = atoi(argv[1]);
    assert(b > 0 && b <= MAXB, "invalid b");
    hashinit();
    for (j = 0; j < b; j++) {
        a[0] = 0;
        a++;   /* zeros at negative elements
    }
    db = 1;
    for (j = 1; j < b; j++) {
        /* db = (db * d) % q; */
        db = mod((double) db * d, q);
```

```
                                                        1100
/* decom.c -- decompress files made by precom.c
   Usage: precom
   Reads stdin and writes decompressed file onto stdout
*/ include <stdlib.h>
include <stdio.h>
include <ctype.h> typedef long PosType;
define MAXN 100000000
char a[MAXN];    /* Output string storage */
PosType n=0;     /* File size */ void addchar(char c)
{   a[n++] = c;
    putchar(c);
} int getint()  /* gobble nondigit at end */
{   int c, n = 0;
    for (;;) {
        c = getchar();  /* danger: no EOF */
        if (!isdigit(c)) break;
        n = 10*n + c - '0';
    }
    return n;
} int main()
{   PosType i;
    int c, start, len;
    while ((c=getchar()) != EOF) {
        if (c == '<') {
            c = getchar();  /* danger: no EOF */
            if (c == '<') {  /* quoted < */
                addchar('<');
            } else {
                ungetc(c, stdin);
                start = getint();
                len = getint();
                for (i = start; i < start+len; i++)
                    addchar(a[i]);
            }
        } else
            addchar(c);
    }
    return 0;
}
```

1110 braces the `addchar` and `getint` functions.
1120 braces the `main` function.

METHOD AND APPARATUS FOR DATA COMPRESSION USING FINGERPRINTING

FIELD OF THE INVENTION

The present invention relates generally to data storage and communications systems and, more particularly, to improving the capacity and use of such data storage and communications systems.

BACKGROUND OF THE INVENTION

Conventional data compression techniques and systems encode a stream of digital data into a compressed code stream and decode the compressed code stream back into a corresponding original data stream. The code stream is referred to as "compressed" because the stream typically consists of a smaller number of codes than symbols contained in the original data stream. Such smaller codes can be advantageously stored in a corresponding smaller amount of memory than the original data. Further, the compressed code stream can be transmitted in a communications system, e.g., a wired, wireless, or optical fiber communications system, in a corresponding shorter period of time than the uncompressed original data. The demand for data transmission and storage capacity in today's communications networks, as required by the significant increase in content exchanges across such networks, is ever-increasing. Thus, data compression plays an integral role in most modem transmission protocols and communications networks.

As is well-known, two classes of compression techniques useful in the compression of data are so-called special purpose compression and general purpose compression. Special purpose compression techniques are designed for compressing special types of data and are often relatively inexpensive to implement. For example, well-known special purpose compression techniques include run-length encoding, zero-suppression encoding, null-compression encoding, and pattern substitution. These techniques generally have relatively small compression ratios due to the fact that they compress data which typically possesses common characteristics and redundancies. As will be appreciated, a compression ratio is the measure of the length of the compressed codes relative to the length of the original data. However, special purpose compression techniques tend to be ineffective at compressing data of a more general nature, i.e., data that does not possess a high degree of common characteristics and the like.

In contrast, general purpose compression techniques are not designed for specifically compressing one type of data and are often adapted to different types of data during the actual compression process. Some of the most well-known and useful general purpose compression techniques emanate from a family of algorithms developed by, J. Ziv and A. Lempel, and commonly referred to in the art as "Lempel-Ziv coding". In particular, Ziv et al., "A Universal Algorithm for Sequential Data Compression", *IEEE Transactions on Information Theory*, IT-23(3):337–343, May 1977 (describing the commonly denominated "LZ1" algorithm), and Ziv et al., "Compression of Individual Sequences Via Variable-Rate Coding", *IEEE Transactions on Information Technology*, IT-24(5):530–536, September 1978 (describing the commonly denominated "LZ2" algorithm), which are each hereby incorporated by reference for all purposes. The LZ1 and LZ2 data compression schemes are well-known in the art and need not be discussed in great detail herein.

In brief, the LZ1 (also referred to and known in the art as "LZ77") data compression process is based on the principle that a repeated sequence of characters can be replaced by a reference to an earlier occurrence of the sequence, i.e., matching sequences. The reference, e.g., a pointer, typically includes an indication of the position of the earlier occurrence, e.g., expressed as a byte offset from the start of the repeated sequence, and the number of characters, i.e., the matched length, that are repeated. Typically, the references are represented as "<offset, length>" pairs in accordance with conventional LZ1 coding. In contrast, LZ2 (also referred to and known in the art as "LZ78") compression parses a stream of input data characters into coded values based on an adaptively growing look-up table or dictionary that is produced during the compression. That is, LZ2 does not find matches on any byte boundary and with any length as in LZ1 coding, but instead when a dictionary word is matched by a source string, a new word is added to the dictionary which consists of the matched word plus the following source string byte. In accordance with LZ2 coding, matches are coded as pointers or indexes to the words in the dictionary.

As mentioned above, the art is replete with compression schemes derived on the basic principles embodied by the LZ1 and LZ2 algorithms. For example, Terry A. Welch (see, T. A. Welch, "A Technique for High Performance Data Compression", *IEEE Computer*, pp. 8–19, June 1984, and U.S. Pat. No. 4,558,302, issued to Welch on Dec. 10, 1985, each of which is incorporated by reference for all purposes) later refined the LZ2 coding process to the well-known "Lempel-Ziv-Welch" ("LZW") compression process. Both the LZ2 and LZW compression techniques are based on the generation and use of a so-called string table that maps strings of input characters into fixed-length codes. More particularly, these compression techniques compress a stream of data characters into a compressed stream of codes by serially searching the character stream and generating codes based on sequences of encountered symbols that match corresponding longest possible strings previously stored in the table, i.e., dictionary. As each match is made and a code symbol is generated, the process also stores a new string entry in the dictionary that comprises the matched sequence in the data stream plus the next character symbol encounter in the data stream.

As will be appreciated and as detailed above, the essence of Lempel-Ziv coding is finding strings and substrings which are repeated in the original data stream, e.g., in a document to be transmitted. The repeated phrases in the document under compression are replaced with a pointer to a place where they have occurred earlier in the original data stream, e.g., document. As such, decoding data, e.g., text, which is compressed in this manner simply requires replacing the pointers with the already decoded text to which it points. As is well-known, one primary design consideration in employing Lempel-Ziv coding is determining whether to set a limit on how far back a pointer can reach, and what that limit should be. A further design consideration of Lempel-Ziv coding involves which substrings within the desired limit may be a target of a pointer. That is, the reach of a pointer into earlier text may be unrestricted, i.e., a so-called growing window, or may be restricted to a fixed size window of the previous "N" characters, where N is typically in the range of several thousand characters, e.g., 3 kilobytes. In accordance with this coding repetitions of strings are discovered and compressed only if they both appear in the window. As will be appreciated, the considerations made regarding such Lempel-Ziv coding design choices represent a compromise between speed, memory requirements, and compression ratio. Sliding windows do, however, present at least one drawback: sliding windows do not find strings that occur far apart, e.g., 10,000 character, in the input text.

While prior art compression schemes, such as the aforementioned LZ1, LZ2, and LZW compression methods, provide effective data compression, efforts continue to search for even greater compression to reduce storage requirements and transmission times.

SUMMARY OF THE INVENTION

The present invention provides a method and apparatus for achieving relatively low compression ratios based on our realization of using a longer history and longer common strings of the input data stream as an initial evaluation of the input data prior to applying a compression process, e.g., any Lempel-Ziv compression methodology. That is, given that typical compression processes utilize a relatively short, i.e., the most current few kilobytes, history of the input data to effect the desired compression, we have recognized that utilizing a longer history in conjunction with longer common string sequences provides increased compression efficiencies particularly when compressing larger input streams having larger numbers of repeated long strings.

More particularly, in accordance with the invention, the input data is preprocessed by applying string-matching to the extract long common strings. In accordance with the preferred embodiment, the input data is divided into a series of blocks with each individual block having a uniform size, illustratively, 1000 characters in length. Further, in accordance with the preferred embodiment of the invention, a so-called fingerprint is computed and stored for each block. A fingerprint is a relatively small signature of a large text string. For example, a 1000 character string may be mapped into a 32 bit long fingerprint. As such, identical strings will always have the same fingerprint. Furthermore, unequal strings almost always have unequal fingerprints (within a certain probability factor). In accordance with the invention, the input data stream is traversed and comparison is made between interim fingerprints computed from a particular set of characters of the input stream, illustratively, on a character-by-character basis, and the previously computed and stored fingerprints. In accordance with the preferred embodiment, the input stream is traversed as a function of a sliding window having a uniform block size and the interim fingerprints are computed from the present window of characters and compared to the previously stored fingerprints. Upon detecting a match between the fingerprints, in accordance with the preferred embodiment, the input stream is encoded with an identifier determined as function of the detected match. Illustratively, the encoded identifier contains a starting position of the matching string in the original input stream and the string length. Thereafter, in accordance with the preferred embodiment, a further compression of the preprocessed and encoded input stream is made using Lempel-Ziv compression.

Advantageously, in accordance with the invention, a larger history of the input data is examined with the identification of longer common strings without a significant increase in overall storage requirements. Thus, greater compression ratios are achieved in accordance with the invention with a wide variety of compression methods. That is, the principles of the invention are independent of any particular one compression scheme and, therefore, the advantages of employing the various aspects of invention are realized with a wide variety of compression methodologies.

Fingerprinting, as a string-matching mechanism, is not new. Fingerprints have been used previously for string-matching in text-processing systems and, in particular, for searching for long common strings in a text file. For example, R. M. Karp and M. O. Rabin, "Efficient Randomized Pattern-Matching Algorithms", *IBMJ Res. Develop.*, Vol. 31, No. 2, pp. 249–260, March 1987, which is hereby incorporated by reference for all purposes, describe the use of fingerprints in the context of string searching. It has, however, remained for the inventors herein to recognize that fingerprinting can be employed in the delivery of an elegant compression tool by which enhanced data compression can be delivered to significantly larger input data streams having large numbers of repeated long strings without a significant increase in overall storage requirements.

BRIEF DESCRIPTION OF THE DRAWINGS

FIG. 3 shows an illustrative data structure for storing the input data steam and the fingerprints computed in accordance with the illustrative operations of the invention of FIG. 2;

FIG. 4 shows a series of illustrative uncompressed data streams with a corresponding series of encoded data streams encoded in accordance with the invention;

FIG. 5 shows a select portion of an illustrative input data file;

FIG. 6 shows a select portion of an illustrative encoded data file encoded from the illustrative input data file of FIG. 5 in accordance with the principles of the invention;

FIG. 7 shows a flowchart of illustrative operations for decompressing data in accordance with the invention;

FIG. 8 shows comparison results of compressing text files in accordance with the invention;

FIGS. 9–10 show an illustrative C source code program for compressing data in accordance with the invention as shown in FIG. 2; and FIG. 11 shows an illustrative C source code program for decompressing data in accordance with the invention as shown in FIG. 7.

Throughout this disclosure, unless otherwise noted, like elements, blocks, components or sections in the figures are denoted by the same reference designations.

DETAILED DESCRIPTION

The present invention provides a method and apparatus for achieving relatively low compression ratios based on our realization of using a longer history and longer common strings of the input data stream as an initial evaluation of the input data prior to applying a compression process, e.g., any Lempel-Ziv compression methodology. That is, given that typical compression processes utilize a relatively short, i.e., the most current bytes, history of the input data to effect the desired compression, we have recognized that utilizing a longer history in conjunction with longer common string sequences provides increased compression efficiencies particularly when compressing larger input streams, e.g., large databases, having larger numbers of repeated long strings.

The present invention can be embodied in the form of methods and apparatuses for practicing those methods. The invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The invention can also be embodied in the form of program code, for example, in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Figure 1:
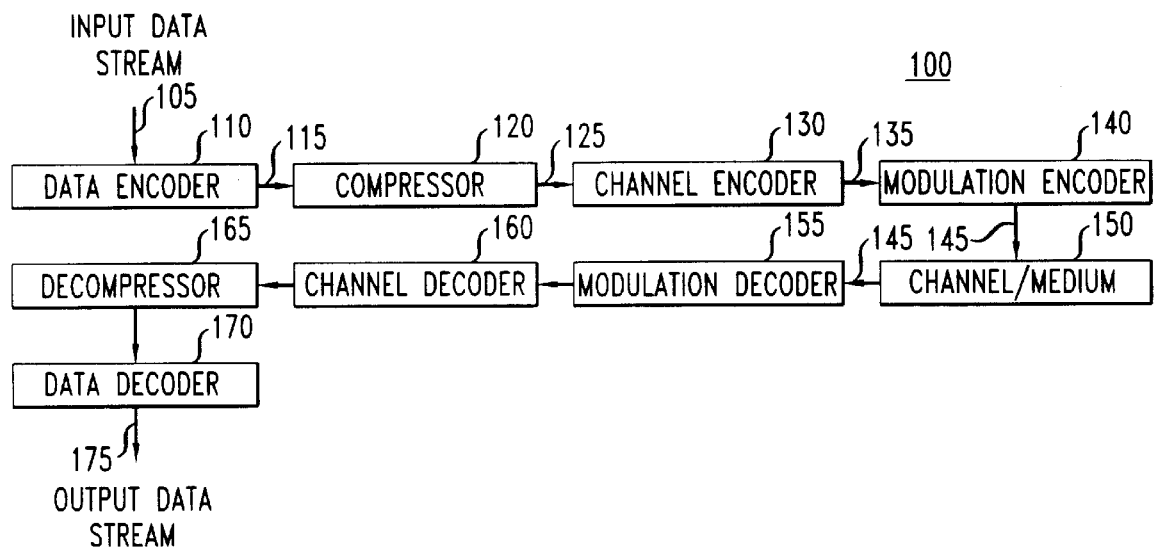
FIG. 1 shows a block diagram of an illustrative system for compressing and decompressing data in accordance with the invention.

FIG. 1 shows a block diagram of an illustrative system 100 for compressing and decompressing data in accordance with the invention. System 100, inter alia., is useful for transmitting and receiving information over a transmission medium, e.g. wire, wireless, or optical fiber, to name just a few. Further, system 100 is alternatively useful for recording information to, and reading information from, for example, a magnetic medium such as computer disk drives, or optical-readable medium such as CD-ROM's. As such, it is possible to record data compressed in accordance with the invention on to recordable medium including magnetic medium, e.g., magnet disk drives, and optical recordable medium, e.g., CD-ROM's. In FIG. 1, input data stream 105, e.g., text, is provided to input data encoder 110. As discussed in greater detail below, input data encoder 110, in accordance with the invention, preprocesses and encodes the input data stream, in accordance with the invention, by applying a string-matching technique to the extract long common strings. The various aspects of the invention directed at this encoding process are described in greater detail below with particular reference to the illustrative operations shown in FIG. 2.

Turning our attention back to FIG. 1, encoded input data stream 115 produced in accordance with the invention is passed to compressor 120. Compressor 120, in accordance with the preferred embodiment of the invention, applies Lempel-Ziv compression, in particular, LZ77coding as discussed above to compress encoded input data stream 115 to compressed data 125. As mentioned above, it will again be noted that any Lempel-Ziv type compression can be used effectively in compressing encoded input data stream 115 in accordance with the invention and for realizing the advantageous aspects of the invention as described herein. Compressed data 125 is then encoded by channel encoder 130 to produce channel encoded information 135. As will be appreciated, channel encoding adds information to the compressed information to enable error detection and/or correction in the data reading process. Conventional channel encoding techniques include well-known Reed-Solomon encoding which encodes a sequence of symbols wherein each symbol is represented by one or more data bits. These symbols are then modulation encoded by modulation encoder 140 which produces modulated data stream 145 which defines a channel sequence that is transmitted through transmission channel or recorded on medium 150.

Noise and interference are often times introduced in channel/medium 150 during the transmission or recording of the data stream. As such, modulation decoder 155 and channel decoder 160 receive modulated data stream 145 with the noise and, in a well-known manner, reverse the encoding processes of channel encoder 130 and modulation encoder 140, respectively. The data stream from channel decoder 160 corresponds to compressed data 125 generated by compressor 120. This data stream is then decompressed by decompressor 165 and decoded by data decoder 170 producing output data stream 175, in accordance with the invention, as described in detail below with regard to FIG. 7 and FIG. 11.

Figure 2:
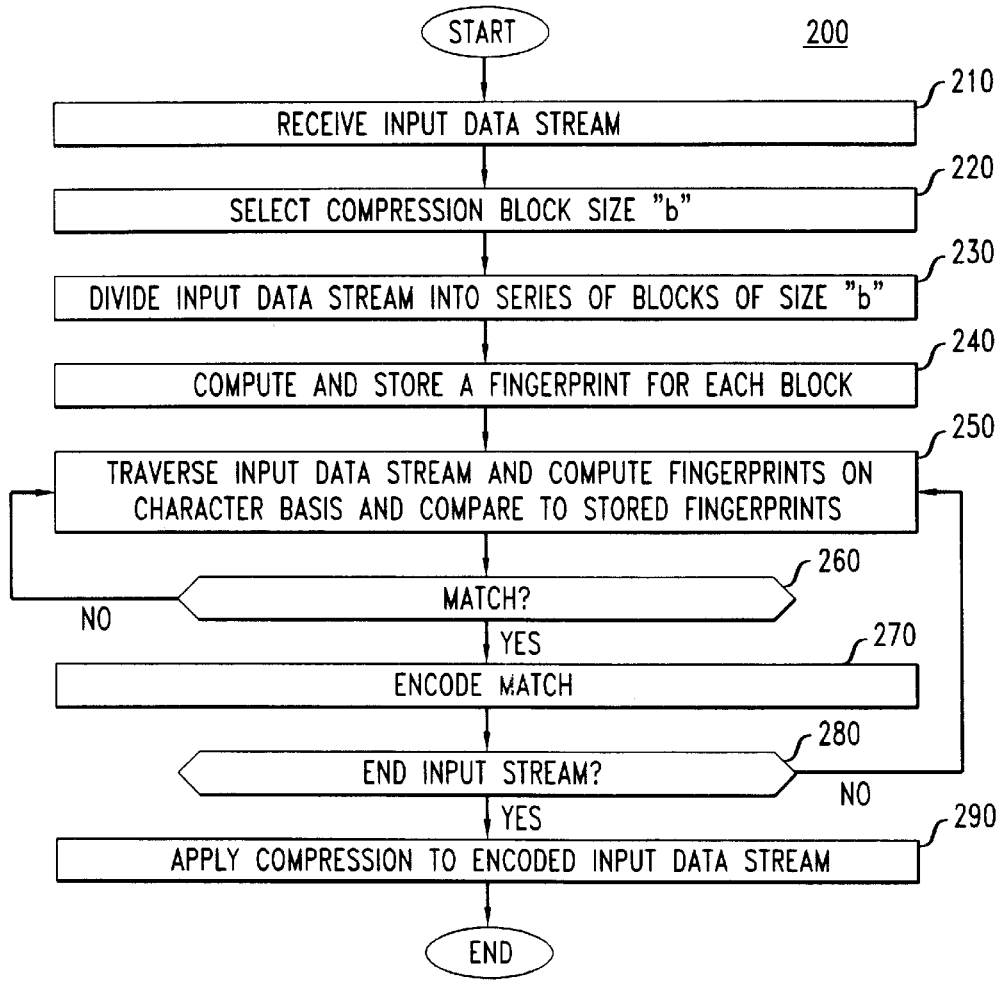
FIG. 2 shows a flowchart of illustrative operations for compressing data in accordance with the invention and useful in the illustrative system of FIG. 1.

The various aspects of the invention are directed to realizing significant compression reductions and transmission efficiencies. FIG. 2 shows a flowchart of illustrative operations for compressing data in accordance with the invention and useful in the illustrative system of FIG. 1 as described above. More particularly, an input data stream, e.g., a text file, is received (block 210) and a particular compression block size "b" is selected (block 220) wherein b is, illustratively, a particular number of characters. In accordance with the preferred embodiments of the invention, b is selected to be in the range of 20 to 1000 characters. The input data stream is divided into a series of blocks (block 230) of size b. Thereafter, in accordance with the invention, a fingerprint is computed and stored (block 240) for each block of the series of blocks.

In accordance with the preferred embodiment of the invention, the fingerprints are computed in accordance with the technique described in Karp et al., supra. In brief, Karp et al. (hereinafter referred to as "Karp") originally used fingerprints as an aid to string searching, i.e., does a string of length n contain a search pattern of length m? Karp interprets the m characters of the pattern as a polynomial modulo a large prime number. As such, the resulting fingerprint can be stored as, e.g., a 32-bit word. Karp's technique scans down the input string and computes the same fingerprints for each of the n−m+1 substrings of length m. If the fingerprints do not match, a conclusion is made that the substring does not match the pattern. If the fingerprints match, a further check is made as to whether the substring in fact matches the pattern. Karp's technique proves several useful properties of their fingerprints: (1) the fingerprints can be computed quickly, i.e., a fingerprint can be initialized in O(m) time and updated by sliding one position in O (1) time; (2) fingerprints yield false matches, i.e., unequal strings are extremely likely to have unequal fingerprints (the probability of two unequal strings having the same 32-bit fingerprint is shown to be approximately $2^{-32}$); and (3) large primes can be chosen at random to yield randomized algorithms for text string searching.

In accordance with the invention, we have recognized that fingerprinting can be employed in the delivery of an elegant compression tool by which enhanced data compression can be delivered to significantly larger input data streams having repeated strings. Advantageously, in accordance with the invention, a larger history of the input data is examined with the identification of longer common strings without a significant increase in overall storage requirements. That is, in accordance with the invention, a data compression arrangement is employed which recognizes a correlation between different strings. In particular, in accordance with the invention, the second occurrence of a particular text string is recognized as repetitious and this second occurrence is replaced with an encoded reference to the first string. Thus, greater compression ratios are achieved in accordance with the invention with a wide variety of compression methods.

The recognition of string repetitions in particular compression schemes is known. For example, J. G. Cleary et al., "Unbounded length contexts for PPM", *Computer Journal* 40, 2/3, pp. 67–75, 1997, and C. G. Neville-Manning et al., "A space-economical suffix tree construction algorithm", *Journal of Artificial Intelligence Research*, pp. 67–82, September 1997, each of which is hereby incorporated by reference for all purposes, describe particular compression schemes which recognize string repetitions. However, in contrast to the present invention, these prior schemes require a significant amount of memory, i.e., approximately n words of primary memory to process a file of n characters, and do not employ the use of fingerprints. As will be seen from the discussion below, greater compression ratios are achieved in accordance with the invention without a dramatic increase in storage requirements.

Turning our attention back to FIG. 2, in accordance with the preferred embodiment, the computed fingerprints are stored for each block (block 240.) In particular, a fingerprint is stored on each block boundary of the input stream. Further, in accordance with the invention, a primary data structure stores the fingerprint of each non-overlapping block of b bytes. That is, in accordance with the preferred embodiment of the invention, fingerprints are stored of bytes 1 . . . b, b+1 . . . 2b, 2b+1 . . . 3b and so forth. In accordance with the preferred embodiment, approximately n/b fingerprints are stored where n is the string length as described above. Advantageously, in accordance with the invention, only a small fraction of the original input stream is stored thereby keeping the necessary storage requirements low. Further, in accordance with the preferred embodiment, the fingerprints are stored and represented in a hash table (a well-known data structure) together with an integer designating the sequence's location in the input data stream.

FIG. 3 shows illustrative data structure 300 for storing the fingerprints computed in accordance with the illustrative operations of the invention of FIG. 2. In particular, data structure 300 stores each block of the input stream (e.g., block 1 through block m shown as blocks 305–325, respectively, in FIG. 3). In addition, for each block, the computed fingerprint in stored, (e.g., FP 1 through FP m shown as fingerprints 330–350, respectively, in FIG. 3). Further, in accordance with the invention and as further discussed below, sliding window 355 is employed for traversing the input data stream, i.e., data structure 300, to compare the current window of characters with the stored fingerprints to detect a match as discussed below.

More particularly, turning our attention back to FIG. 2, in accordance with the invention, the input data stream is traversed and a comparison is made (block 250) between the input characters and the stored fingerprints to detect a match (block 260). That is, a sliding window, e.g., sliding window 355, is employed for traversing the input data stream and for the current window of characters so-called "interim" fingerprints are computed, illustratively, on a character-by-character basis through the current window of characters. These interim fingerprints computed across the current window of characters are compared with the stored fingerprints to detect a match. In particular, as the input text is scanned, the hash table is employed to find common fingerprints and thereby locate common strings. If a match occurs, in accordance with the invention, the match is encoded (block 270) using the sequence "<start, length>", where start is the initial position and length is the size of the common sequence. For example, consider the following input data stream:

"The Constitution of the United States, PREAMBLE We, the people of the United States, in order to form a more perfect union . . ."

Applying the principles of the invention as described above, results in an encoded data stream of:

"The Constitution of the United States, PREAMBLE We, the people <16, 21>, in order to form a more perfect union . . ."

As one can see from the encoded data stream, the repeated string "the people of the United States" has been encoded with an identifier using the "<start, length>" sequence format of the invention and as described above. In accordance with the preferred embodiment, in order to ensure that a block with matching fingerprints is not a so-called false match, an extension of the of the match is made in a backwards and forwards direction (across the input data stream) as far as possible but in no event longer than b−1 characters in length. If several blocks match the current fingerprint, the largest match among such blocks is encoded in accordance with the invention. The comparison of the input characters, i.e., the interim fingerprints, to the fingerprints continues until reaching the end of the input stream (block 280). Thereafter, the encoded data stream, i.e., the original input data stream now encoded in accordance with the invention, is compressed (block 290) using any well-known compression algorithm, e.g., Lempel-Ziv compression.

The following pseudocode describes the fingerprint comparison and encoding aspects of the invention as described above wherein the variable "fp" represents the fingerprint and the function "checkformatch" looks up the fingerprint in the hash table and encodes a match if found:

initialize fp
for (i=b; i <n; i++)
 if(i % b==0)
  store(fp, i)
 update fp to include a[i] and exclude a[i−b]
 checkformatch(fp, i)

As will be appreciated, the above-described pseudocode can be used by those skilled in the art to develop a variety of programs, e.g., a C program, for execution in a processor for implementing the invention. For example, FIGS. 9–10 show an illustrative C source code program 900 for compressing data in accordance with the invention. Illustrative source code program 900 includes program source code section 910 having program instructions which in a well-known manner define certain data types, variables, and data structures used throughout source code program 900. Program source code section 920 includes program instructions which implement the string matching operations in accordance with the invention as described above. Program source code section 930 includes program instructions which assist in defining and populating the hash table data structure used for storing the computed fingerprints in accordance with the invention as described above. Program source code sections 940 and 950 (see, FIG. 10) include program instructions which complete the compression for producing the encoded data file, in accordance with the invention, as described above. As will be appreciated, C source code program 900 is illustrative in nature and presented to further the understanding of the present invention. Those skilled in the art will be able to readily develop other programs which, although not explicitly described or shown herein, embody the principles of the invention and are included within its spirit and scope.

In order to further illustrate the various aspects of the inventions as described above, FIG. 4 shows a series of short illustrative uncompressed input data streams 400 with a corresponding series of encoded output data streams 410 encoded in accordance with the invention. As one can see from examination of FIG. 4, input data streams 420–450 have each been processed, in accordance with the invention, with a encoded designation of matching strings as shown in encoded output 460–490, respectively.

Figure 6:
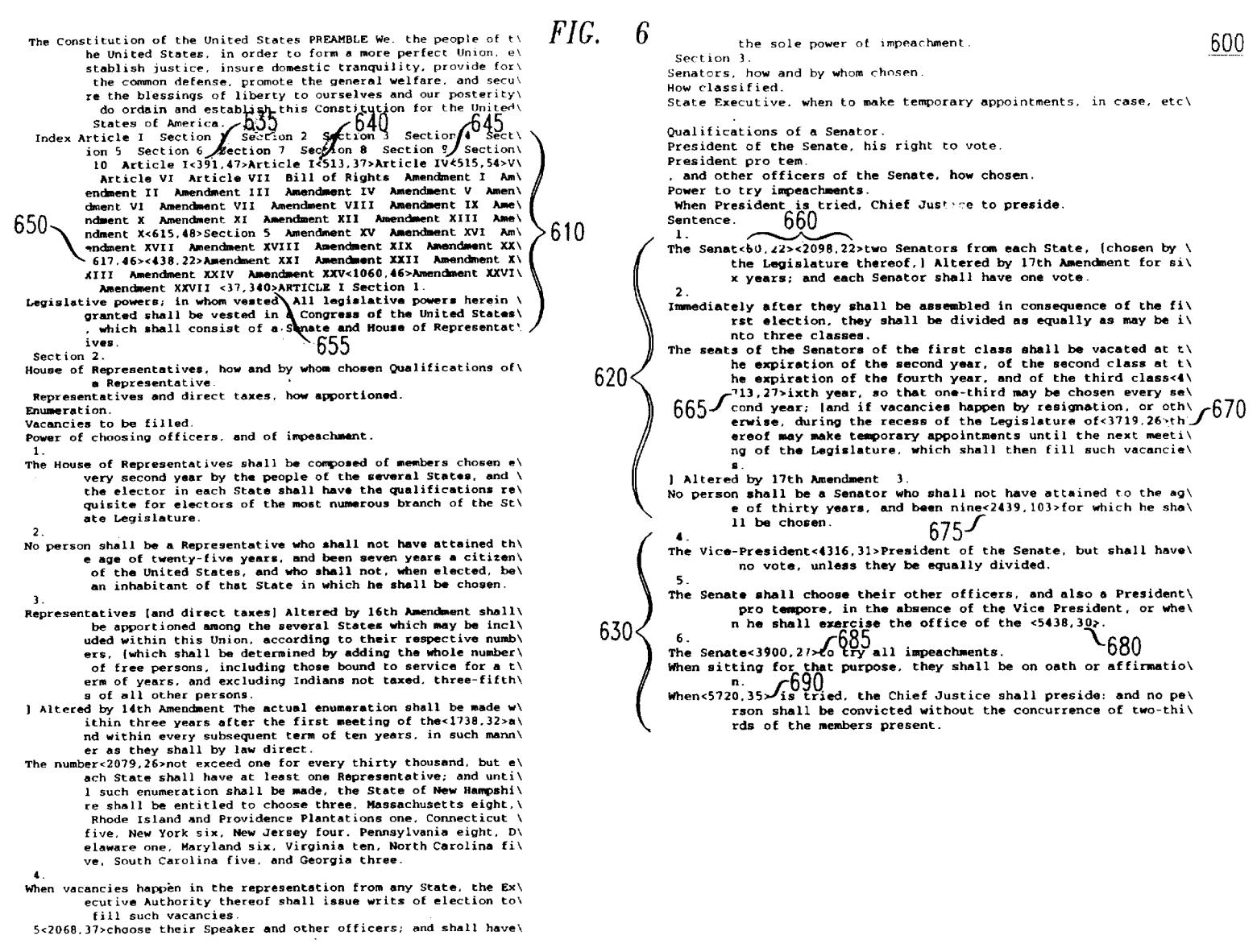

Further, a more comprehensive illustration of the invention is shown in FIG. 5 and FIG. 6 which illustrate the application of the principles of the invention on a larger input data file, in particular, the Constitution of the United States of America. More particularly, FIG. 5 shows illustrative input data file 500 which consists of a select portion of the Constitution. Compression of the text of the Constitution in accordance with the invention is particularly advantageous given the frequent appearance of the same long strings. For example, text sections 510, 520, and 530, respectively, of input data file 500 contain several long repeated strings. Thus, applying the various aspects of the invention as described above, results in illustrative encoded data file 600 shown in FIG. 6. As can be seen in FIG. 6, encoded data file 600 includes encoded sections 610, 620, and 630 which respectively correspond to text sections 510, 520, and 530 of input data file 500. Encoded sections 610, 620, and 630, each include encodings, e.g., encodings 635–690, derived in accordance with the invention, using a block size =20, and which can be further compressed to achieve increased compression ratios and more efficient data transmission rates. For example, encoding 635 indicates that beginning in character position 391, a matching sequence of 47 characters, i.e., a matching string, has been detected and encoded. Similarly, for example, encoding 675 indicates that beginning in character position 2439, a matching sequence of 103 characters has been detected and encoded.

Our realization of using fingerprints in an initial evaluation, i.e., preprocessing, of the input data prior to applying a compression process results in achieving relatively low compression ratios based using a longer history and longer common strings of the input data stream. Significantly, our invention does not require a significant increase in storage requirements and is independent of any particular one compression technique. That is, the invention can be employed with a wide variety of well-known compression algorithms for achieving significant compression ratios thereby reducing storage requirements and transmission times.

Prior to describing certain compression testing results which further detail the advantages of various aspects of the invention, the decompression of the encoded data files which result in using the invention will now be discussed. In particular, FIG. 7 shows a flowchart of illustrative operations 700 for decompressing data in accordance with a further aspect of the invention. In particular, from the encoded data file of the invention, e.g., encoded data file 600 as described above, individual characters "c" are retrieved (block 710), illustratively, on a character-by-character basis. In accordance this aspect of the invention, a determination is made as to whether the particular character c matches the symbol "<" (block 720). If no match occurs, the character c is written to the output file in accordance with the decompression process (block 730) and the next character is retrieved from the encoded data file. If a match occurs, the next character is retrieved from the encoded data file (block 740). Again, a determination is made as to whether the particular character c matches the symbol "<" (block 750). If a match occurs, the symbol "<" is written to the output file (block 760) and the next character is retrieved. If no match occurs, the "<start, length>" encoding, as described above in great detail, is read (block 770) from the encoded file. In accordance with this embodiment of the invention, using the <start, length> information, a string is copied to the output file from the encoded file beginning at the "start" position and which has a length equal to the "length" information (block 780). That is, in accordance with the invention, the previously encoded matching string is now decompressed in its entirety and written to the output file. If more characters remain (block 790) the decompression process continues. If not, the decompression process is completed and the output file is complete.

The decompression process of the invention as described above, can be illustratively executed by a computer, processor or DSP, and the like. More particularly, FIG. 11 shows an illustrative C source code program 1100 for implementing the illustrative operations for decompressing data in accordance with the invention as shown in FIG. 7. In particular, source code program section 1110 defines an array for manipulating the encoded data file and the individual characters contained therein. Source code program section 1120 executes the main part of the program for processing the characters, in accordance with the invention and as described above, and decompressing the encoded file to produce an output file. As will be appreciated, C source code program 1100 is illustrative in nature and presented to further the understanding of the present invention. Those skilled in the art will be able to readily develop other programs which, although not explicitly described or shown herein, embody the principles of the invention and are included within its spirit and scope.

To illustrate the various aspects of the invention and their advantages, we applied our invention in the context of a very large file and compared a variety of results in compression of that file. More particularly, this illustrative example concatenated all of the text files contained in the well-known "Project Gutenberg Compact Disc" available on CD-ROM from Walnut Creek CDROM, Walnut Creek, Calif. The Project Gutenberg CD is a 1994 compilation of documents which include: the U.S. Constitution, the Declaration of Independence, inaugural speeches given by several U.S. Presidents, fiction works such as *Alice in Wonderland* and *O, Pioneers*!, to name just a few. In accordance with the illustrative test, we concatenated all of the text files using the well-known UNIX "cat" command, in particular, the UNIX command string was "cat */* .txt >gut94all.txt". Such a concatenation resulted in an illustrative input file of 66.122 megabytes to which the principles of the invention were applied.

More particularly, FIG. 8 shows comparison results 800 of compressing the concatenation of the Project Gutenberg CD's text files. The file sizes show in the comparison results are given in megabytes, and the percentages show the effectiveness of each compression, and, in particular, the effect of changing the block size b (column 810.) Column 820, having the heading "com b", shows the effect of applying the present invention and the resulting change in the size of the input text file. Column 830 (having the heading "com %") shows the compression percentage achieved, in accordance with the invention, by varying block sizes. Column 840 (having the heading "com b|gzip") and column 850 (having the heading "gzip %") show the results of applying the well-known "gzip" compression algorithm, i.e., the well-known GNU gzip implementation of LZ77, in conjunction with principles of the invention. For example, using a block size of 1000 and applying gzip in conjunction with the invention results in reducing the original file size by 19.7%. As one can see, as the block size b decreases the compression obtainable, in accordance with the invention, increases until reaching some non-optimal point, i.e., too small a block size for efficient compression. Further, column 860 (having the heading "total %") shows that the optimal choice of b is 31 wherein com gives a 22.5% reduction in file size beyond that of gzip.

The foregoing merely illustrates the principles of the present invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the Applicant(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flowcharts, flow diagrams, state transition diagrams, pseudocode, program code, and the like represent various processes which may be substantially represented in computer readable medium and so executed by a computer, machine, or processor, whether or not such computer, machine, or processor, is explicitly shown.

Further, in the claims hereof any element expressed as a means for performing a specified function is intended to encompass any way of performing that function, including, for example, a) a combination of circuit elements which performs that function; or b) software in any form (including, therefore, firmware, object code, microcode or the like) combined with appropriate circuitry for executing that software to perform the function. The invention defined by such claims resides in the fact that the functionalities provided by the various recited means are combined and brought together in the manner which the claims call for. Applicants thus regard any means which can provide those functionalities as equivalent as those shown herein.

We claim:

1. A method for compressing an input stream of data comprising:
    dividing the input stream of data into a plurality of data blocks, the input stream of data comprising a series of characters;
    computing a plurality of fingerprints, each fingerprint of the plurality of fingerprints corresponding to a different one data block of the plurality of data blocks;
    comparing the input stream of data to the plurality of fingerprints, and if a match occurs between a particular fingerprint and the input stream of data, encoding the match within the input stream of data, wherein the comparing the input stream of data operation serially traverses the input stream as a function of individual characters of the series of characters and computes an interim fingerprint as a function of each or the individual characters; and
    compressing the encoded input stream of data into a compressed data stream.

2. The method of claim 1 further comprising:
    storing the plurality of data blocks together with the plurality of fingerprints in a data structure.

3. The method of claim 1 wherein the comparing the input stream of data operation further comprises:
    identifying a longest match sequence from the series of characters which matches the particular fingerprint.

4. The method of claim 1 wherein the comparing the input stream of data operation compares the interim fingerprint to the particular fingerprint.

5. The method of claim 3 wherein the encoding the match operation encodes a starting position within the input stream of data of the longest match sequence and a length of the longest match sequence.

6. A method of processing an input stream of data into a compressed code stream, the input stream of data including a plurality characters, the method comprising:
    dividing the input stream of data into a plurality of blocks, each block containing a particular number of characters of the plurality of characters;
    computing a plurality of fingerprints, each fingerprint of the plurality of fingerprints corresponding to a different one block of the plurality of blocks;
    comparing the plurality of blocks to the plurality of fingerprints to determine whether a match occurs between a particular fingerprint and any portion of a particular block;
    encoding, for each match, a identifier within the input stream of data, the identifier including at least a starting position within the input stream of data of the matching portion of the particular block and a length of the matching portion; and
    compressing the encoded input stream of data into the compressed code stream;
wherein the compressing the encoded input stream of data operation is performed according to a Lempel-Ziv coding technique.

7. The method of claim 6 wherein the comparing operation further comprises:
    selecting a window size; and
    traversing the plurality of blocks as a function of the window size.

8. The method of claim 7 wherein the window size is a particular number of characters.

9. The method of claim 8 wherein the comparing the plurality of blocks operation further comprises:
    computing a interim fingerprint for the block at each character of the particular number contained in the block; and
    comparing the interim fingerprint to the particular fingerprint.

10. The method of claim 8 wherein each block of the plurality of blocks is of a equal block size.

11. The method of claim 10 wherein the equal block size is in a range of 10 to 1000 characters.

12. The method of claim 9 wherein the traversing of the plurality of blocks is done serially through the particular number of characters contained in the block.

13. The method of claim 6 further comprising:
    storing the plurality of blocks together with the plurality of fingerprints in a data structure, the data structure storing each fingerprint with its respective different one corresponding block.

14. The method of claim 13 wherein the starting position is a character position within the input stream of data and the length of the matching portion is a number of characters.

15. A data compression apparatus comprising:
    a receiver for receiving and dividing a input stream of data into a plurality of blocks, each block containing a particular number of characters of a plurality of characters from the input stream of data;

an encoder for (i) computing a plurality of fingerprints, each fingerprint of the plurality of fingerprints corresponding to a different one block of the plurality of blocks, (ii) comparing the plurality of blocks to the plurality of fingerprints, the comparing the plurality of blocks to the plurality of fingerprints in the encoder further comprising: (a) computing an interim fingerprint for the block at each character of the particular number of characters contained in the block; and (b) comparing the interim fingerprint to the particular fingerprint, (iii) determining whether a match occurs between a particular fingerprint and any portion of a particular block, and (iv) encoding, for each match, an identifier of the match within the input stream of data; and a compressor for compressing the encoded input stream of data into a compressed code stream.

16. The data compression apparatus of claim 15 wherein the identifier includes at least a starting position within the input stream of data of the matching portion of the particular block and a length of the matching portion.

17. The data compression apparatus of claim 16 wherein each block of the plurality of blocks is of a equal block size.

18. The data compression apparatus of claim 17 wherein the starting position is a character position within the input stream of data and the length of the matching portion is a number of characters.

19. The data compression apparatus of claim 15 wherein the compressor utilizes Lempel-Ziv coding for the compressing the encoded input stream of data into the compressed code stream.

20. A data storage system for storing a digital data stream in compressed data form, the data storage system comprising:

means for dividing the digital data stream into a plurality of data blocks, each block of the plurality of data blocks having a plurality of characters;

means for storing the plurality of data blocks together with the plurality of fingerprints in a data structure;

means for computing a plurality of fingerprints, each fingerprint of the plurality of fingerprints corresponding to a different one data block of the plurality of data blocks;

means for traversing the plurality of blocks and means for computing a interim fingerprint for each block at each character of the plurality of characters for the block, the means for traversing the plurality of blocks operation serially traverses the blocks as a function of the plurality of characters of each block, and means for comparing the interim fingerprint to a particular fingerprint of the plurality of fingerprints, and if a match occurs between the particular fingerprint and the interim fingerprint, means for encoding the match within the digital data stream; and means for compressing the encoded digital data stream into the compressed data form.

21. The data storage system of claim 20 wherein the means for compressing utilizes Lempel-Ziv coding for the compressing the encoded digital data stream of data into the compressed data form.

22. The data compression apparatus of claim 20 wherein the encoded match includes at least a starting position within the digital data stream of the matching portion of the particular block and a length of the matching portion.

23. An apparatus for processing a compressed digital signal, the compressed digital signal being produced by (i) dividing an input stream of digital data into a plurality of data blocks and each block of the plurality of blocks contains a plurality of characters, (ii) computing a plurality of fingerprints, each fingerprint of the plurality of fingerprints corresponding to a different one data block of the plurality of data blocks, (iii) comparing the input stream of digital data to the plurality of fingerprints, the comparing the input stream of digital data to the plurality of fingerprints further comprising: (a) computing an interim fingerprint for the block at each character of the plurality characters of the block; and (b) comparing the interim fingerprint to the particular fingerprint, and if a match occurs between a particular fingerprint and the input stream of digital data, encoding the match within the input stream of digital data, compressing the encoded input stream of digital data into the compressed digital signal, and applying the compressed digital signal to a communications channel, the apparatus comprising:

a receiver for receiving the compressed digital signal from the communications channel; and a decompressor for decompressing the received compressed digital signal, and recovering the input stream of digital data from the decompressed digital signal.

24. The apparatus of claim 23 wherein each block of the plurality of blocks is of a equal block size.

25. The apparatus of claim 23 wherein each fingerprint of the plurality of fingerprints is a representation of particular ones of the characters of its corresponding data block.

26. A machine-readable medium having stored thereon a plurality of instructions, the plurality of instructions including instructions that, when executed by a machine, cause the machine to perform of a method of processing an input stream of data into a compressed code stream, the input stream of data including a plurality characters, dividing the input stream of data into a plurality of blocks, each block containing a particular number of characters of the plurality of characters, computing a plurality of fingerprints, each fingerprint of the plurality of fingerprints corresponding to a different one block of the plurality of blocks, comparing the plurality of blocks to the plurality of fingerprints such that the comparing the plurality of blocks to the plurality of fingerprints is performed as a function the characters in the block, and an interim fingerprint for the block is computed at each character of the plurality of characters and compared to the particular fingerprint, determining whether a match occurs between a particular fingerprint and any portion of a particular block, encoding, for each match, an identifier of the match within the input stream of data, the identifier including at least a starting position within the input stream of data of the matching portion of the particular block and a length of the matching portion, and compressing the encoded input stream of data into the compressed code stream.

* * * * *